(12) United States Patent
Pedersen

(10) Patent No.: US 7,506,228 B2
(45) Date of Patent: Mar. 17, 2009

(54) MEASURING THE INTERNAL CLOCK SPEED OF AN INTEGRATED CIRCUIT

(75) Inventor: Frode Milch Pedersen, Trondheim (NO)

(73) Assignee: ATMEL Corporation, San Jose, CA (US)

( * ) Notice: Subject to any disclaimer, the term of this patent is extended or adjusted under 35 U.S.C. 154(b) by 248 days.

(21) Appl. No.: 11/353,855

(22) Filed: Feb. 14, 2006

(65) Prior Publication Data

US 2007/0192658 A1 Aug. 16, 2007

(51) Int. Cl.
  *G01R 31/28* (2006.01)
(52) U.S. Cl. ............... 714/724; 714/700; 324/763; 324/765
(58) Field of Classification Search .................. None
  See application file for complete search history.

(56) References Cited

U.S. PATENT DOCUMENTS

| 5,381,420 | A | * | 1/1995 | Henry ..................... 714/731 |
| 5,434,804 | A | * | 7/1995 | Bock et al. ................ 702/117 |
| 5,805,608 | A |   | 9/1998 | Baeg et al. |
| 6,185,732 | B1 |  | 2/2001 | Mann et al. |
| 6,321,329 | B1 |  | 11/2001 | Jaggar et al. |
| 6,476,594 | B1 | * | 11/2002 | Roisen .................. 324/76.54 |
| 6,834,356 | B1 |   | 12/2004 | McNeil |
| 7,184,936 | B1 | * | 2/2007 | Bhandari ................. 702/189 |
| 7,260,653 | B2 | * | 8/2007 | Le Scolan et al. .......... 709/248 |
| 2002/0175720 | A1 | * | 11/2002 | Huang et al. ............... 327/113 |
| 2003/0061535 | A1 | * | 3/2003 | Bickel ......................... 714/11 |
| 2005/0149800 | A1 | * | 7/2005 | Jones et al. ................. 714/726 |

FOREIGN PATENT DOCUMENTS

| EP | 0 514 700 | 7/1998 |
| JP | 2000020339 | 1/2000 |
| JP | 2002373086 | 12/2002 |

OTHER PUBLICATIONS

Paul Hoakstra, A Wavelets Approach to Voice Recognition, Nov. 29, 2001, Gran Valley State University, http://www.gvsu.edu/math/wavelets/student_work/Hoekstra/voice_recognition.htm, pp. 10-11.*

(Continued)

*Primary Examiner*—Cynthia Britt
*Assistant Examiner*—Steven D Radosevich
(74) *Attorney, Agent, or Firm*—Fish & Richardson P.C.

(57) ABSTRACT

A system and methods to transfer data between a testing interface and an IC. The system may include a synchronization subsystem to monitor the transitions of the test interface clock and/or IC clock to determine a clock adjustment appropriate to substantially synchronize the clocks. In certain implementations, a synchronization unit on an IC under test counts a predetermined number of transitions of an internal clock of an embedded device and generates a signal upon reaching a terminal count, which signal is received by a host controller associated with a JTAG test fixture. In such implementations, the host controller determines the number of IC clock cycles that occurred during the predetermined number of IC clock cycles and synthesizes a synchronized JTAG clock that is a integral fraction of the IC clock.

26 Claims, 6 Drawing Sheets

OTHER PUBLICATIONS

Wikipedia, Frequency, Jan. 1, 2004 noted by internet archive"waybackmachine", Wikipedia, http://en.wikipedia.org/wiki/Frequency p. 1.*

Internet archive "waybackmachine" for Wikipedia, with respect to Frequency, p. 1, http://web.archive.org/web/*/http://en.wikipedia.org/wiki/Frequency.*

"IEEE Standard Test Access Port and Boundary-Scan Architecture" IEEE Std 1149.1-2001 (Revision of IEEE Std 1149.1-1990) 208 pages.

Blackhawk™ Emulation Technical Article "Using the Adaptive Clocking Feature of the TI OMAP™ Platform—*Adding OMAP Adaptive Clocking support to TI JTAG Emulators*" Jun. 2005, 3 pages.

* cited by examiner

MEASURING THE INTERNAL CLOCK SPEED OF AN INTEGRATED CIRCUIT

BACKGROUND

Advances in surface mount technology and printed circuit (PC) board manufacture have resulted in more complex and smaller PC boards that have higher integrated circuit (IC) density. Surface mount devices (SMDs) or very large-scale integrated (VLSI) circuits often have minimal spacing between pins. SMDs may be now mounted to both sides of the PC board.

"Contact" test methods for such devices (in which the test fixture directly contacts the pins or other electrical contacts on the board), have become correspondingly more complex and costly. In order to test certain devices with higher pin pitches, some test fixtures are configured with smaller probe tips or alternate electrical contact apparatus. Similarly, testing devices having ICs mounted on both sides of the PC board has sometimes required substantial modification of pre-existing text fixtures.

In 1990, the Institute of Electrical and Electronic Engineers (IEEE) adopted a standard for a non-contact method of testing PC boards. According to the 1149.1 standard, also known as the IEEE Standard Test Access Port and Boundary Scan Architecture, logic can be incorporated into an IC that may allow for test methods that may include in-circuit testing of an IC itself, interconnection testing of interconnections between ICs in an assembled PC board, and operation testing for observing and modifying of circuit activity during normal operation. The test logic may allow software to control and observe boundary scan cells electronically during test or normal operation. A boundary scan cell may be located adjacent to each IC pin so that signals at the IC boundaries can be controlled and observed. Each boundary scan cell may include a shift register stage. The boundary scan cells may allow test data to be electronically placed on an output pin or to be observed electronically on an input pin for an IC without the need for a physical probe. The boundary scan cells for the pins of an IC may be interconnected to form a shift register chain. The chain may include serial input and output connections and clock and control signals. The test data may be shifted serially into and out of boundary scan registers that can be connected on a bus within the IC. The boundary scan bus and other building blocks may be accessed through a Test Access Port (TAP).

In many conventional implementations, the TAP controls an interface between the boundary scan registers on the IC and the boundary scan bus. The TAP controller can be implemented as a state machine controlling the operations associated with the boundary scan cells. The TAP controller interface can be based on four ports. The Test Clock (TCK), Test Mode Select (TMS), Test Data In (TDI), and Test Data Out (TDO) ports may be used to control the basic operation of the TAP controller. The TCK and TMS ports may direct signals between TAP controller states. The TDI and TDO ports may receive the data input and output values serially from the boundary scan registers. An optional fifth port, Test Reset (TRST), may be implemented as an asynchronous reset signal to the TAP controller.

In many conventional implementations, a serial protocol, such as a Joint Test Action Group (JTAG) protocol can be used to communicate with the TAP controller. A JTAG device, e.g., an external test device, can use the JTAG protocol to implement a full duplex serial synchronous protocol for communication with the TAP controller. The TAP controller in the IC may run at the TCK provided by a JTAG master, which may in turn initiate and control the communication. Many microcontrollers, however, may operate at an internal clock that is independent of the TCK. During programming and debugging operations of the microcontroller, the transfer of data between the TCK and internal clock domains may occur. In order to effectuate the data transfer it is sometimes desirable to synchronize the clock domains.

SUMMARY

A system to transfer data between a testing interface and an IC may include a synchronization subsystem to monitor the transitions of the test interface clock and/or IC clock to determine the adjustment appropriate to substantially synchronize the clocks. In certain embodiments, a synchronization unit on an IC under test counts a predetermined number of transitions of an internal clock of an embedded device and generates a signal upon reaching a terminal count, which signal is received by a host controller associated with a JTAG test fixture. In such implementations, the host controller determines the number of JTAG clock cycles that occurred during the predetermined number of IC clock cycles and synthesizes a synchronized JTAG clock that is an integral fraction of the IC clock.

Particular embodiments of the invention can be implemented to realize one or more of the following advantages. First, the JTAG test fixture may be used to test embedded devices having a variety of different internal clock speeds without having to reconfigure the JTAG test fixture for each such device. Second, the transitions of the embedded clock may be accurately measured by a local control unit, which in turns yields more accurate synchronization of the JTAG and embedded clocks. Third, JTAG clocks may be efficiently down-converted to appropriate integer fractions of the internal clock of the embedded device under test. Additionally, embedded devices may be designed so that some JTAG instructions require the JTAG clock to be lower than an integer fraction of the embedded clock, which in turns simplifies synchronization logic and may lower costs.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION OF ILLUSTRATIVE EMBODIMENTS

Figure 1:
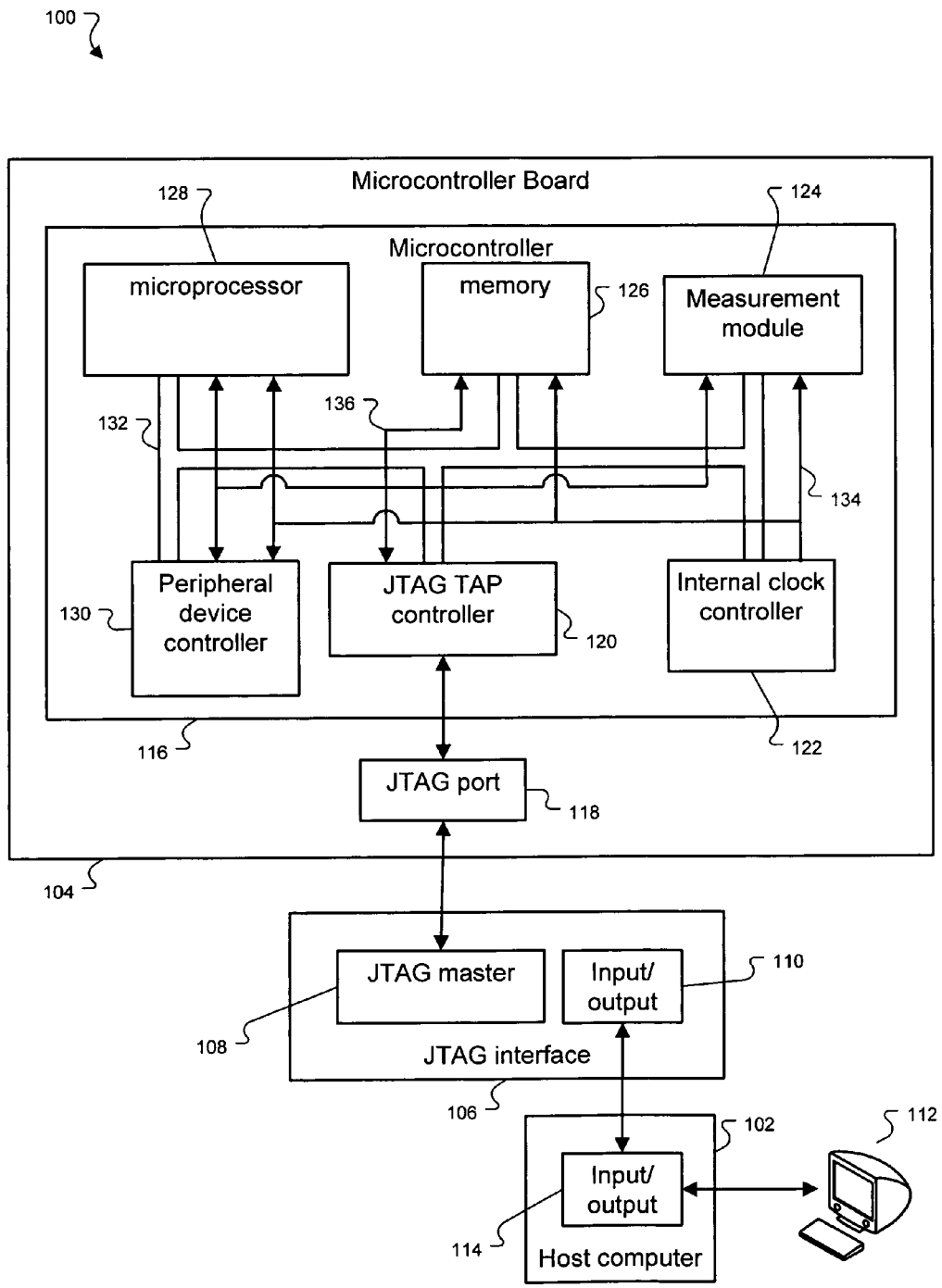
FIG. 1 is a block diagram of an exemplary computer system that measures the internal clock speed of a microcontroller.

FIG. 1 is a block diagram of an exemplary computer system that measures the internal clock speed of a device (e.g., a microcontroller). By way of example, reference will be made to a microcontroller configuration below. Those of ordinary skill in the art will recognize that the methods and systems disclosed have applicability to other embedded configuration devices. The computer system 100 includes a host computer 102 connected to a microcontroller board 104 by way of a JTAG interface 106. The JTAG interface 106 consists of a JTAG master 108 and an input/output port 110. A user by way of user device 112 connected to an input/output port 114 on the host computer 102 can operate the microcontroller board 104 by sending control information to the board by way of the input/output port 114 to an input/output port 110 on the JTAG interface 106. For example, a user may type in a command on the keyboard of user device 112 which will be processed by an application running on the host computer 102 resulting in an instruction being sent to the JTAG interface 106. The instruction is sent by way of input/output port 114 to input/output port 110 which may be a universal serial bus (USB) connection between the host computer 102 and the JTAG interface 106. In another implementation, the user device 112 and the host computer 102 may be one device consisting of a laptop computer.

The instruction received on the input/output port 110 may be sent to the JTAG master 108 for interpretation. The JTAG master 108, upon receiving the instruction, can interpret the instruction and determine the JTAG instructions and signals to be sent to the microcontroller board 104.

The microcontroller board 104 includes a microcontroller 116 and a JTAG port 118. The microcontroller 116, in this example, is a single IC that includes a JTAG TAP controller 120, an internal clock controller 122, a measurement module 124, memory 126, a microprocessor 128 and a peripheral device controller 130. The microcontroller 116 also includes a bus 132, an internal clock signal 134 and internal JTAG signals 136. The signals sent from the JTAG master 108 to the pins on the JTAG port 118 may include the JTAG clock (TCK), TDO, TDI and TMS. The signals on these pins can be received on corresponding inputs on the JTAG TAP controller 120. Optionally the TSRT signal may be sent.

The JTAG TAP controller 120 processes the instruction and data information it receives to determine the test interface to measure or control within the microcontroller. The state machine in the JTAG TAP controller 120, which will be described in more detail in FIG. 2, can control the operation of the JTAG TAP controller 120. The TDO and TDI signals can comprise the internal JTAG signals 136 which are connected to some or all of the circuits within the microcontroller. The internal clock controller 122 may include logic to generate the internal clock signal 134 which may be used by the modules contained within the microcontroller with the exception of the JTAG TAP controller 120. The JTAG TAP controller 120 receives TCK clock provided by the JTAG master 108. The microprocessor 128 provides the core logic and control for the microcontroller 116 and may utilize the memory 126 for storage of its program instructions as well as data. The memory 126, for example, may include Electrically Erasable and Programmable Read Only Memory (EEPROMs) for instruction storage and dynamic Dynamic Random Access memory (DRAM) for data storage. In another example, the memory 126 may include Flash memory and Static Random Access Memory (SRAM).

The peripheral device controller 130 may include the logic for the microcontroller 116 to connect to and/or communicate with other devices. For example, the peripheral device controller 130 may contain logic for the microcontroller to connect to a digital signal processor allowing it the ability to process digital image data, for example, a color image from a digital camera. In this example, the digital image data may be received by the microcontroller by way of an input device connected to the peripheral device controller 130.

The measurement module 124 may include logic to allow the measurement of the internal clock signal 134 with respect to the TCK signal. This measurement may be used for the purpose of determining the optimum frequency of the TCK signal for testing and debugging of the microcontroller 116.

The bus 132 may include address and data bits that are propagated throughout the microcontroller 116 that can allow the core logic in the microprocessor 128 to access and control the other logic modules within the microcontroller 116.

Figure 2:
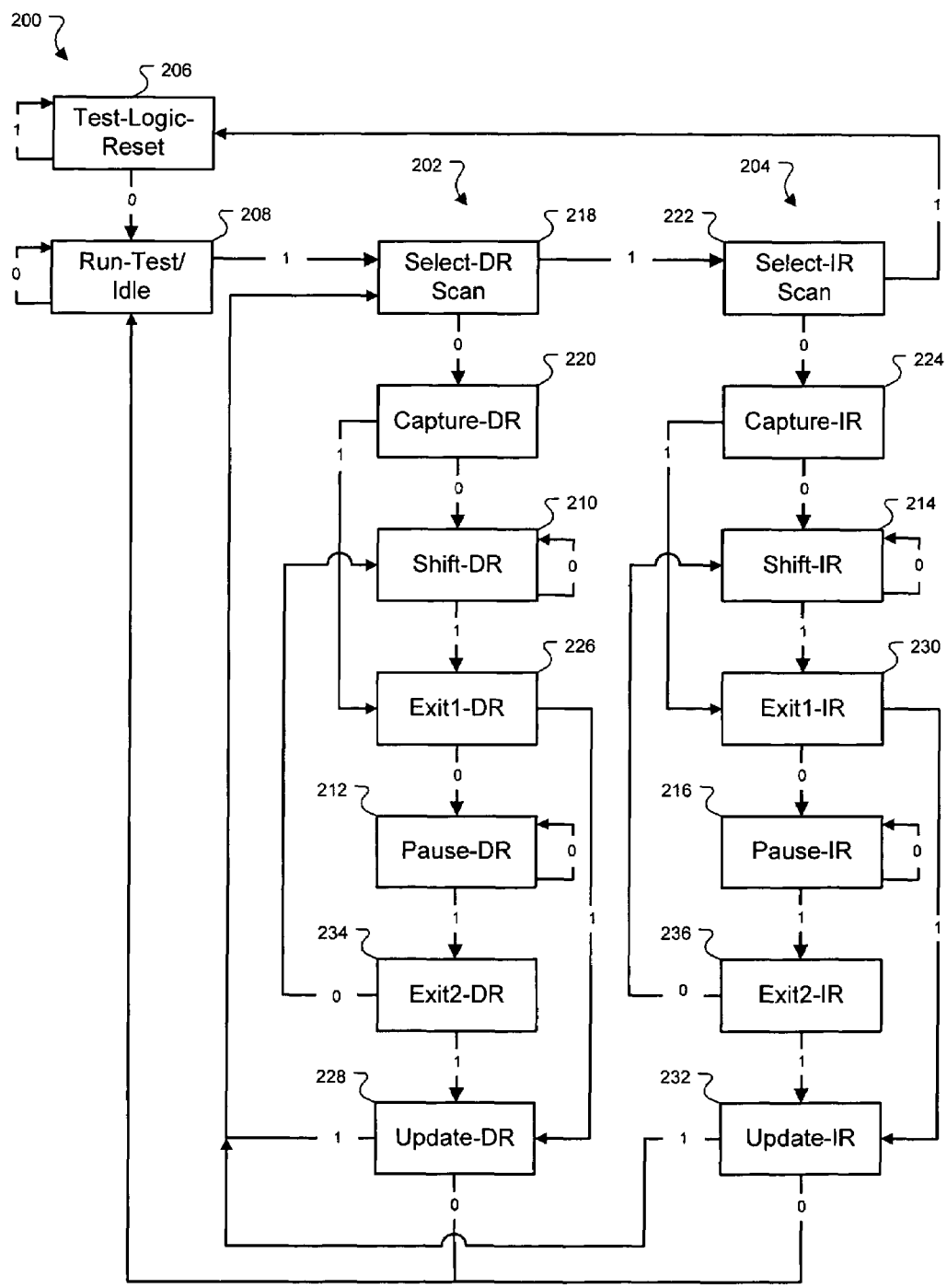
FIG. 2 is a state diagram of the JTAG TAP controller.

FIG. 2 is a state diagram 200 of the JTAG TAP controller 120, as shown in reference to FIG. 1. The state diagram shows an example state machine, which includes state transitions that are controlled by the TMS signal and driven by the TCK signal. In one implementation, each state has two exits allowing all transitions to be controlled by the one TMS signal.

Two paths in the state diagram 200 are a data register path 202 and an instruction register path 204. The data register path 202 can include controls for the operations on data registers. The controls can include the boundary scan register (BSR), which is connected between the TDO and TDI signals for input and output. The controls can also include the bypass register, which allows TDI and TDO to be connected to a single bit pass through register for input and output. The data register to be operated on, when the data register path 202 is taken, is selected based on the value loaded in an instruction register. The instruction register path 204 can include controls for operations on an instruction register.

In one implementation the state machine includes six ready states: Test-Logic-Reset state 206, Run-Test/Idle state 208, Shift-DR state 210, Pause-DR state 212, Shift-IR state 214, and Pause-IR state 216. The Test-Logic-Reset state 206 is the steady state that exists for the condition when TMS is set high (i.e. equal to 1).

At power up or during normal operation of the microcontroller, the JTAG TAP controller 120 is placed into the Test-Logic-Reset state 206 by driving the TMS input high and applying, for example, five or more TCKs. In this state, the JTAG TAP controller 120 issues a reset signal that places all test logic in a condition that does not impede normal operation of the microcontroller. A protocol is applied by way of the TMS input signal and the TCK signal causing the JTAG TAP controller 120 to exit the Test-Logic-Reset state 206 and enter the Run-Test/Idle state 208 when test access is required. An instruction register (IR) scan can be issued to the JTAG TAP controller 120 transitioning it through the instruction register path 204 from the Run-Test/Idle state 208. A data register (DR) scan can also be issued to the JTAG TAP controller 120 transitioning it through the data register path 202 from the Run-Test/Idle state 208.

The states of the data register path 202 and the instruction register path 204, in this example, are mirror images of each other, adding symmetry to the state transitions. In one implementation the first action that can occur when either path is entered is a capture operation. The data register path 202 is entered though a Select-DR Scan state 218 transitioning to a Capture-DR state 220. The instruction register path is entered by transitions through the Select-DR Scan state 218 and a Select-IR Scan state 222 to a Capture-IR state 224.

For example, an operation can include a transition path through the data register path 202 and instruction register path 204. The operation can load a new data value into the currently selected data register and read back the old data value. The value of the currently selected data register that will be shifted out can be captured upon entry to the Capture-DR state 220. The new value can be shifted into the currently selected data register from the TDI line, for example one bit at a time, upon entry to the Shift-DR state 210. The old value of the currently selected data register can be shifted out to the TDO line, for example one bit at a time, upon exit from the Shift-DR state 210. The JTAG TAP controller 120 transitions to an Exit1-DR state 226 when complete. The value of the currently selected data register can be transferred to the output pins, in the case of the boundary scan register, upon entry to an Update-DR state 228 after exiting the Exit1-DR state 226. The JTAG TAP controller 120 transitions to the Run-Test/Idle state 208 terminating the operation.

The value of the instruction register that will be shifted out can be captured upon entry into the Capture-IR state 224. The old value can be shifted out, for example one bit at a time upon entry to the Shift-IR state 214. The new value can be shifted into the instruction register, for example one bit at a time, upon exit from the Shift-IR state 214. The JTAG TAP controller transitions to an Exit1-IR state 230 when complete. The new value shifted into the instruction register can be applied and the instruction takes effect upon entry into an Update-IR state 232. The JTAG TAP controller 120 transitions to the Run-Test/Idle state 208 terminating the operation.

The pause state may be entered to temporarily suspend the shifting of data through either the selected data register, in the case of Pause-DR 212, or the instruction register, in the case of Pause-IR 216. The pause may occur while a required operation, for example refilling a tester memory buffer, is performed. In the case of the data register path 202, shifting can resume from the Pause-DR state 212 by way of an Exit2-DR state 234. Shifting can also be ended by way of the Exit2-DR state 234 and the Update-DR state 228. The Update-DR state 228 then transitions to the Run-Test/Idle state 208. In the case of the instruction register path 204, shifting can resume from the Pause-IR 216 state by way of an Exit2-IR state 236. Shifting can also be ended by way of the Exit2-IR 236 state and the Update-IR state 232. The Update-IR state 232 then transitions to the Run-Test/Idle state 208.

Figure 3:
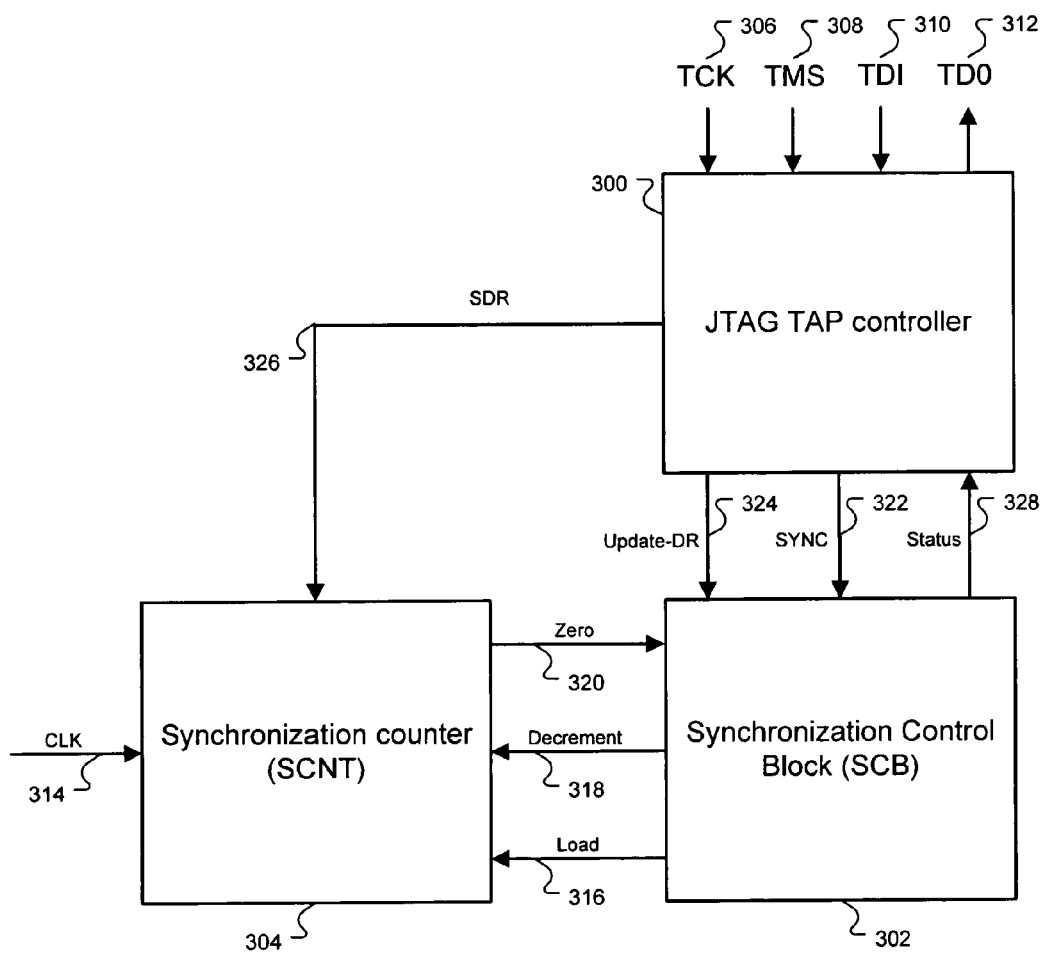
FIG. 3 is a block diagram of an exemplary system used to measure the internal clock speed of a microcontroller.

FIG. 3 is a block diagram of an exemplary system used to measure the internal clock speed of a microcontroller. The system can include a JTAG TAP controller 300, a synchronization control block (SCB) 302, and a synchronization counter (SCNT) 304. The JTAG TAP controller 300 can include input pins: test clock input TCK 306, test mode select TMS 308, test data input TDI 310 and test data output TDO 312. The TCK 306 can provide the clock input to the boundary scan module of the microcontroller, which controls the access of the boundary scan registers and bus on the microcontroller. The TMS 308 can provide the control signal that determines the transitions of the JTAG TAP controller state machine, as was described in FIG. 2. TDO 312 can be a serial data output pin, which can provide instruction, test and programming data. TDI 310 can be a serial data input pin, which can provide instruction, test and programming data. The TMS 308, TCK 306 and optionally the TRST (not shown) pins may operate the JTAG TAP controller 300 and the TDO 312 and TDI 310 pins can provide a serial path for the data registers which can be the boundary scan registers in the microcontroller. The TDI 310 pin can also provide data to an instruction register, which may generate the control logic for the data registers.

The SCNT 304 can be a synchronous down counter. It can operate at the internal clock frequency (CLK) 314 of the microcontroller. The SCB 302 can contain control logic to interface to the SCNT 304 and the JTAG TAP controller 300. The JTAG TAP controller 300 can provide the SYNC 322 input to the SCB 302 to synchronize operations between the JTAG TAP controller 300 and the SCB 302. The SCB 302 can control when the count is loaded, by sending a load signal 316 to the SCNT 304. The SCB 302 can also control when the count begins decrementing by sending a decrement signal 318 to the SCNT 304. When the count reaches zero, the SCNT 304 can send a zero flag 320 to the SCB 302.

The SCB 302 can accept decoded command information from the JTAG TAP controller 300. When a vendor-defined instruction JTAG_SYNC is loaded into the JTAG master, the JTAG TAP controller 300 enters into the Update-DR state sending an Update-DR signal 324 to the SCB 302 enabling the count to be loaded by way of a serial data register (SDR) 326. The SCB 302 sends the load signal 316 to the SCNT 304, which enables the loading of the SDR 326 into the SCNT 304. The decrement signal 318 is then sent to the SCNT 304 starting the SCNT 304 counting down. The JTAG TAP controller 300 can continuously receive the vendor defined JTAG_SYNC instruction. A status flag 328 can be continuously captured by the JTAG TAP controller 300 during the Capture-IR state of the vendor-defined JTAG_SYNC instruction and reported on TDO 312 as a BUSY status bit. The SCNT 304 counts down to zero and asserts the zero flag 320. The SCB 302 receives the zero flag 320 and asserts the status flag 328. The JTAG TAP controller 300 can capture the status flag 328 during the Capture-IR state of the vendor-defined JTAG_SYNC instruction. The JTAG TAP controller 300 can then assert the BUSY status bit on TDO 312. TDO 312 is sent to the JTAG master. Vendor-defined JTAG_SYNC instructions are not sent in this implementation.

Figure 4:
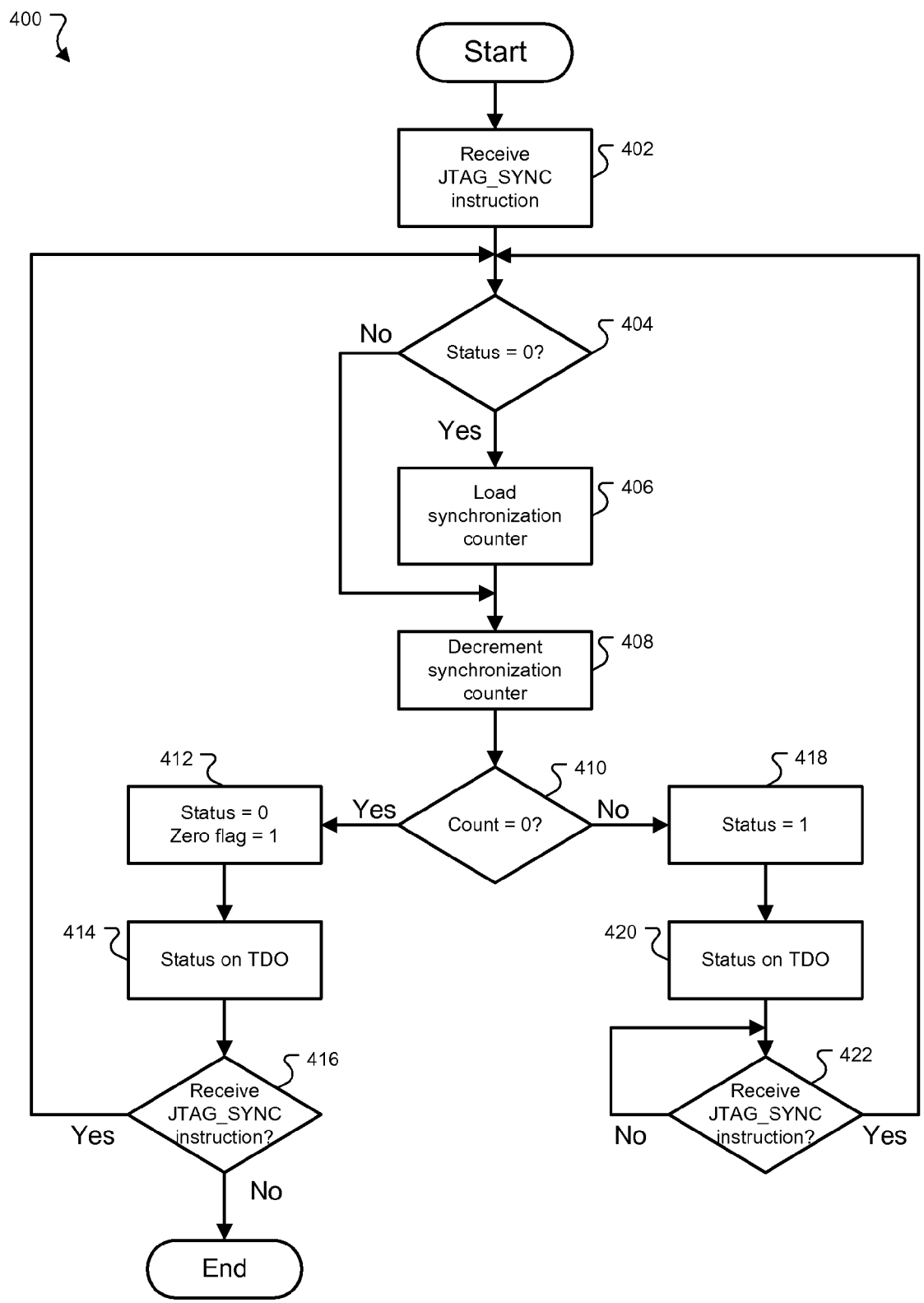
FIG. 4 is a flowchart of an exemplary method in the microcontroller for measuring the internal clock speed of a microcontroller.

FIG. 4 is a flowchart of an exemplary method 400 in the microcontroller for measuring the internal clock speed of a microcontroller. The method 400 starts when the JTAG TAP controller 300, as described in reference to FIG. 3, receives a vendor defined JTAG instruction, JTAG_SYNC, and decodes it (step 402). For example, the instruction can be received from the JTAG master 108, as described in reference to FIG. 1. This instruction can be implemented in the SCNT 304 and SCB 302, as shown with reference to FIG. 3. If, in step 404, the status flag 328 is not set (e.g., equal to zero), the SCNT 304 will be loaded with a count value, N, to be decremented. The SCB 302 controls the loading of the SCNT 304 with the count value, N, from the data register in step 406. The JTAG TAP controller state machine, as described with reference to FIG. 2, can perform This operation by entering the Shift-DR state and scanning the count value, N, into the selected data register. Next the controller will enter into the Update-DR state, which will initialize the SCNT 304 with the count value, N. The load signal 316 is then set equal to one in the SCB 302. The SCB 302 then starts the SCNT 304 counting down, in step 408, by sending the decrement signal 318 to the SCNT 304. The SCNT 304 begins counting down at the internal clock frequency 314. The method 400 will then proceed to step 410. If however, in step 404, the status flag 328 is not set (e.g., not equal to zero), the method 400 will proceed to step 410.

In step 410, if it is determined that the count in the SCNT 304 is zero, the zero flag 320 in the SCNT 304 is asserted in step 412, and the status flag 328 in the SCB 302 is reset (e.g., made equal to zero). The status flag 328 is shifted into the Update-IR state and sent to the JTAG master on TDO as a BUSY status bit, in step 414. Next, in step 416, if another JTAG_SYNC instruction is not received in the JTAG TAP controller the method 400 ends. However, if another JTAG_SYNC instruction is received, the method 400 continues to step 404. In step 404, it is determined that the status flag 328 is not set (e.g., equal to zero), and the method 400 proceeds to step 406.

However, in step 410, if it is determined that the count in the SCNT 304 is not equal to zero, the zero flag 320 in the SCNT 304 is not asserted. Next, in step 418, the status flag 328 in the SCB 302 is set (e.g., equal to one). The status flag 328 is shifted into the Update-IR state and sent to the JTAG master on TDO as a BUSY status bit, in step 420. Next, in step 422, the method 400 waits to receive another JTAG_SYNC instruction. The method 400 proceeds to step 404 upon receiving the JTAG_SYNC instruction in the JTAG TAP controller. In step 404, it is determined that the status flag 328 is not set (e.g., equal to zero) therefore the method proceeds to step 410.

To keep the synchronization logic simple in this example, the JTAG master does not scan a new value into the SDR 326 while the BUSY status bit on TDO is set (e.g., equal to one). The BUSY status bit on TDO is an indication of the status of the process in the SCNT 304. The BUSY status bit on TDO being set (e.g., equal to one) indicates that the SCNT 304 is still counting down and therefore a new count value should not be loaded into the counter. The value captured into the SDR 326 during the Capture-DR state, when the BUSY status bit on TDO is set (e.g., equal to one), is left undefined. However, the JTAG master may scan a new count value, N, into the SDR 326 if the BUSY status bit on TDO is not set (e.g., equal to zero). In this case, the SCB 302 will control the loading of the SCNT 304 with the count value, N, in the data register. Also it is assumed that the SDR 326 value is stable until captured by SCNT 304 independent of the clock ratio between the CLK and TCK.

Figure 5:
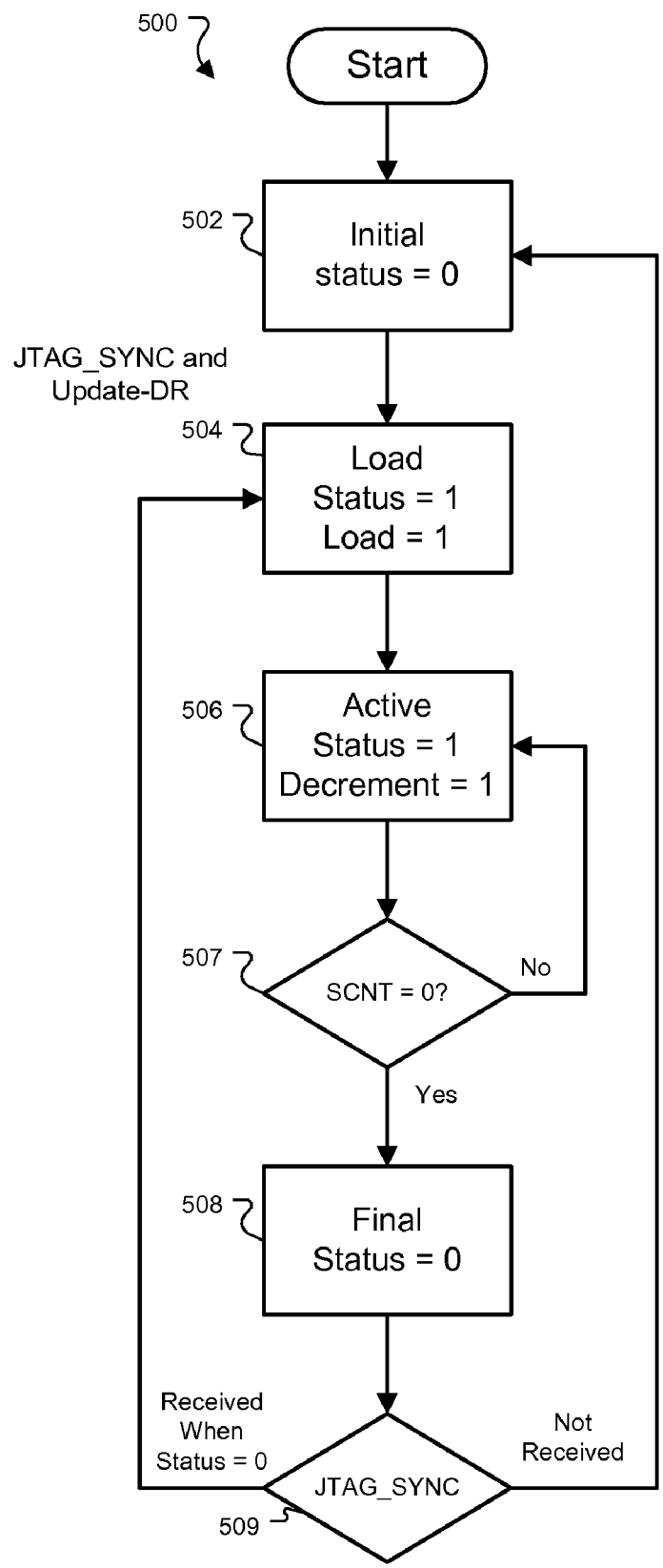
FIG. 5 is a state diagram of the synchronization control block shown in FIG. 3.

FIG. 5 is a state diagram 500 of the SCB 302 as shown in FIG. 3. The SCB 302 is responsible for synchronizing the internal clock frequency measurement between the SCNT 304 and the JTAG TAP controller 300. In one implementation, the SCB 302 includes logic that allows the acceptance of any clock ratio between the TCK and CLK frequencies.

The status flag 328 is reset (e.g., equal to zero) in an initial state 502 of the SCB 302. The JTAG TAP controller state machine can enter the Shift-DR state and scan the count value, N, into the selected data register when the JTAG TAP controller receives a JTAG_SYNC instruction. Next, the controller can enter the Update-DR state which initializes the SCNT 304 with the count value, N. This can result in a load state 504. In this state, the load signal 316 of the SCB 302 can be set (e.g., equal to one) and received by the SCNT 304. This can result in the loading of the SDR 326 into the SCNT 304. The status flag 328 is set (e.g., equal to one) indicating the SCNT 304 is busy.

Next, the SCB 302 can transition to an active state 506. In this state, the status flag 328 is set (e.g., equal to one) and the decrement signal 318 can be set (e.g., equal to one) and sent to the SCNT 304. The SCNT 304 can begin decrementing when it receives the decrement signal 318. The SCB 302 can remain in the active state 506 until the SCNT 304 counts down to zero (as indicated by decision box 507). When this occurs, the SCB 302 can receive the zero flag 320 from the SCNT 304. The SCB 302 can transition to the final state 508. In this state, the status flag 328 can be reset (e.g., equal to zero). The SCB 302 may transition to the initial state 502 of the JTAG TAP controller if no additional JTAG_SYNC instruction is received (as indicated by decision box 509). However, if the JTAG TAP controller receives a JTAG_SYNC instruction when the status flag 328 is not asserted (e.g., equal to zero), the SCB 302 can transition to the load state 504.

Figure 6:
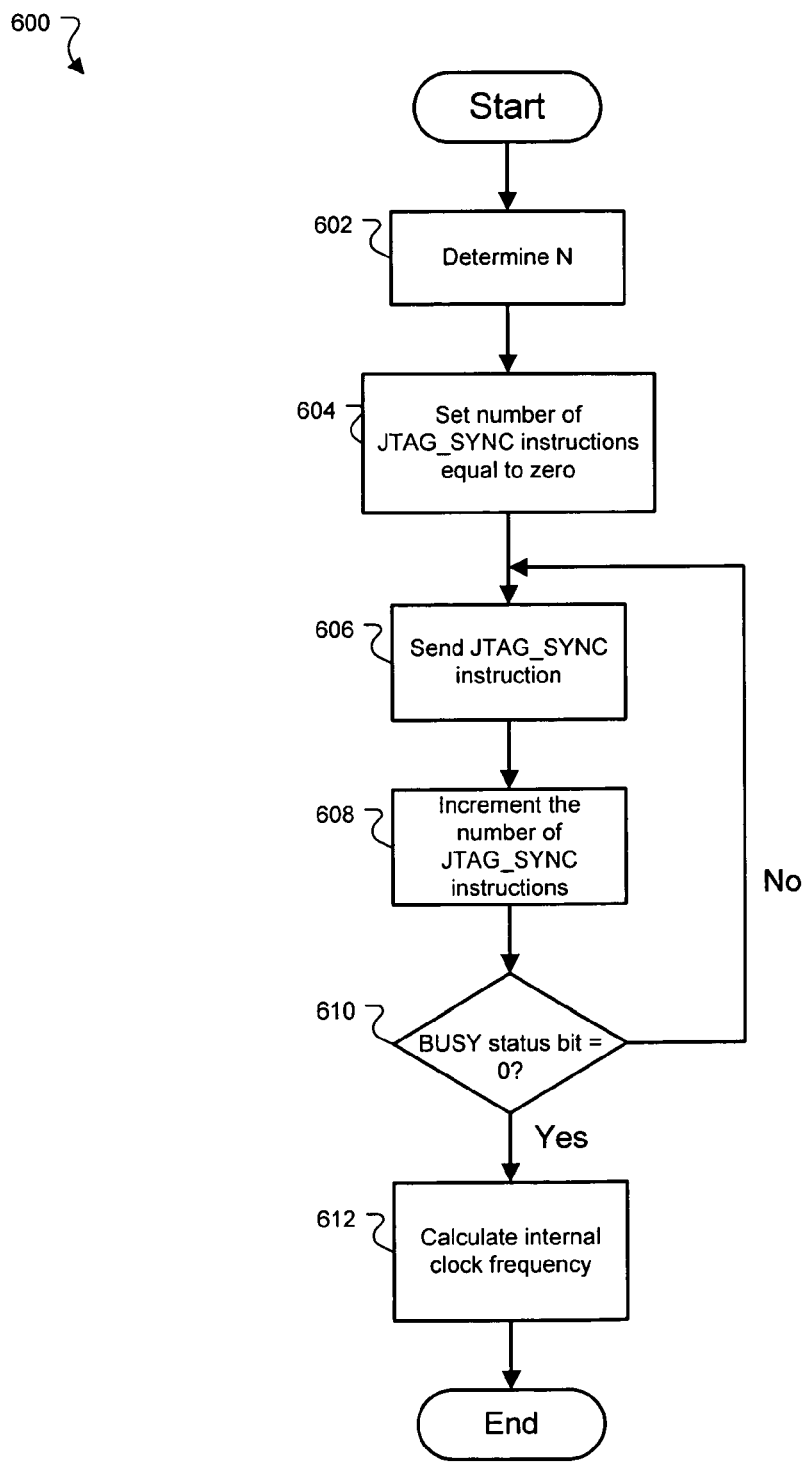
FIG. 6 is a flow chart of an exemplary method in the JTAG master for measuring the internal clock speed of a microcontroller.

FIG. 6 is a flow chart of an exemplary method 600 in the JTAG master 108 for measuring the internal clock speed of a microcontroller. The method 600 may be initiated by, for example, a user on user device 112 entering a command into the host computer 102, by way of the user device keyboard, initiating a microcontroller clock measurement process whose method was described in reference to FIG. 4. The JTAG master can first determine, in step 602, the count value, N. The count value is the number of counts of the CLK 314, as shown in reference to F*ig.* 3, that the SCNT 304 will count down while JTAG_SYNC instructions are sent to the JTAG TAP controller 300, as described in the method 400 of FIG. 4. The count value for example, can be a number hardcoded in the JTAG master 108 of the JTAG interface 106, as shown in reference to FIG. 1. In another implementation, the count value can be sent from the host computer 102 by way of user device 102 to the JTAG master 108 for delivery to the JTAG TAP controller 120 The selection of the count value may dictate the accuracy of the measurement of the CLK frequency. As the count value increases, the accuracy of the CLK frequency measurement increases in various embodiments, relative to the latencies associated with the transmission and processing of the JTAG_SYNC and BUSY signals (described further below). In particular, as the count value increases, the duration of the microcontroller clock measurement process also increases, which in turn decreases the relative impact of the latencies on the accuracy of the synchronization measurements.

Next, in step 604, the JTAG master can reset the counter containing the number of JTAG_SYNC instructions, P, equal to zero. In step 606, the JTAG master can send the JTAG_SYNC instruction to the JTAG TAP controller. The instruction contains the count value, N. The JTAG master can then increment the number of JTAG_SYNC instructions in step 608. The JTAG master can then observe the value of the BUSY status bit on TDO returned from the JTAG TAP controller in step 610. If the value of the BUSY status bit on TDO is not asserted (e.g., equal to zero), the JTAG master may stop sending the JTAG_SYNC instructions. If the value of the BUSY status bit on TDO is asserted (e.g., equal to one) in step 610, the JTAG master continues to step 606 sending another JTAG_SYNC instruction.

Upon completion of sending JTAG_SYNC instructions, the measurement of the internal frequency of the microcontroller can be calculated in step 612. Once this calculation is completed, the process ends.

For example, the JTAG master 108 on the JTAG interface 106 may perform the calculation. In another embodiment, the host computer 102 performs the calculation. The ratio of the frequency of TCK to the frequency of CLK can be approximated by dividing the total number of TCK cycles, M, that occurred while the SCNT 304, clocked by the CLK, counted down the count value, N, to zero. The total number of TCK cycles, M, can be calculated by determining the number of TCK clock cycles needed to execute one JTAG_SYNC instruction, I, multiplied by the number of JTAG_SYNC instructions, P, executed before the SCNT 304 counted down the count value, N, to zero.

$$M = I * P$$

$$\text{Frequency}_{TCK}/\text{Frequency}_{CLK} = M/N + \Delta$$

where the maximum deviation, $\Delta$, can be:

$$\Delta = I/N$$

As the count value N increases, the maximum deviation, $\Delta$, decreases which can result in a more accurate measurement of the internal microcontroller clock frequency. However, as the count value N increases, the measurement duration of the microcontroller clock measurement process also increases. In various illustrative implementations, N ranges from 8 to $2^{32}$ and is preferably in the range of 16 to $2^{16}$.

The calculated value of the microcontroller internal clock may be used by the JTAG master in determining the TCK signal to the JTAG TAP controller. This allows the JTAG master to select the maximum internal clock frequency for TCK relative to the microcontroller internal clock frequency, allowing synchronization between the JTAG TAP controller and the microcontroller. The methods described with reference to FIG. 4 and FIG. 6 may perform the microcontroller clock measurement process without the need for configuration input or data from a user or other external source. The JTAG master, having knowledge of the microcontroller internal clock frequency as a result of the measurement, has the ability to synchronize its communication to the microcontroller at an optimum speed. This allows for optimized throughput in testing, programming and debugging operations.

In various implementations, the JTAG clock is synthesized so that it is a specified fraction or multiple of the embedded clock. For instance, the JTAG clock may be synthesized so as to have a frequency that is an integer fraction of the embedded clock frequency, such as one half, one quarter, or one eighth. The fraction or multiple may be dynamically determined, hard-coded into the system, or user-specified.

In certain implementations, the synthesis of the JTAG clock may account for latencies such as in the processing of SYNC signals, BUSY signals. For instance, a user may specify latencies or the JTAG master may be configured to measure the latencies in terms of the number of JTAG clock cycles required for the device under test to respond to a test signal.

In another implementation, the JTAG interface 106, as described in reference to FIG. 1, may be included on the microcontroller board 104 eliminating the need for a separate interface device. In this implementation, the host computer 102 by way of input/output 114 would connect to the JTAG master 108 by way of input/output 110. The JTAG master 108 would then directly connect to the JTAG TAP controller 120 eliminating the need for the JTAG port 118.

Other implementations may use a different full-duplex serial communication protocol than the one defined for the JTAG interface. These protocols may include RS-485, Ethernet 802.3, or a proprietary full-duplex serial communication protocol.

Various implementations may include the measurement module 124 as a module on the microcontroller board, external to the microcontroller. The microcontroller may interface to the external measurement module by way of an external address and data bus which can include the JTAG TAP controller specific signals as data input to and output from the external measurement module. The microcontroller clock would also be provided externally to the measurement module. This would allow the microcontroller to be contained in a small package, for example.

In another implementation, the measurement module 124 may contain an up counter. The count value loaded into the SCNT would be compared with a counter value in the SCNT and when they were equal a flag would be asserted and sent to the SCB.

In another implementation, a custom JTAG TAP controller may contain the JTAG TAP state machine as well as the JTAG master logic. This could result in a single chip system eliminating the need for a JTAG interface device.

A number of embodiments of the invention have been described. Nevertheless, it will be understood that various modifications may be made without departing from the spirit and scope of the invention. Accordingly, other embodiments are within the scope of the following claims.

What is claimed is:

1. A method of determining frequency of a device clock for a device under test, the device under test having a test access port that receives a measurement command and a test clock signal having a test clock frequency and corresponding test clock period, the method comprising:
   identifying a number of test clock periods occurring during a first period;
   identifying a number of periods of the device clock that occur during a time period substantially equal to the first period; and
   determining the frequency of the device clock in response to the measurement command and based on the identified number of periods of the device clock, the identified number of test clock periods, and the test clock frequency.

2. The method of claim 1, where the test access port comprises a JTAG interface.

3. The method of claim 1, further comprising adjusting the test clock frequency to be an integer fraction of the determined frequency of the device clock.

4. The method of claim 3, where a user specifies a desired ratio between the frequency of the test clock signal and the frequency of the device clock.

5. The method of claim 1, wherein determining the frequency of the device clock comprises accounting for latencies in identifying the number of test clock periods or number of periods of the device clock.

6. The method of claim 1, where the device under test comprises an embedded controller.

7. The method of claim 1, where identifying comprises counting.

8. The method of claim 1, wherein identifying the number of periods of the device clock comprises decrementing or incrementing a value stored in a counter.

9. The method of claim 1, where identifying the number of periods of the device clock comprises counting the number of periods of the device clock with a counter.

10. The method of claim 1, where determining the frequency of the device clock comprises determining a ratio of the frequency of the device clock and the frequency of the test clock signal.

11. The method of claim 1, where a controller on a host side of the test access port determines the frequency of the device clock.

12. The method of claim 1, further comprising sequentially determining the frequency of the device clock for a plurality of devices under test, each device under test having a device clock with a substantially different device clock frequency.

13. The method of claim 12, where the devices under test comprise embedded controllers.

14. The method of claim 1, further comprising counting a predetermined number of device clock periods.

15. The method of claim 14, further comprising receiving a signal at the test access port that indicates whether the count of the predetermined number of device clock periods is complete.

16. The method of claim 14, where a user specifies a number of device clock periods to be counted.

17. An embedded clock measurement system, comprising:
   an interface controller to receive a serial access port clock signal having a serial clock frequency and corresponding serial clock period, and a measurement command, said interface controller being disposed on an embedded device under test and coupled to a serial access port; and a measurement module coupled to the interface controller and an embedded clock, said measurement module operable to count a predetermined number of periods of the embedded clock following receipt of the measurement command, the predetermined number of periods being specified by the measurement command, and to transmit, after counting the predetermined number of periods of the embedded clock, a count signal encoding a number of serial clock periods that elapse while the predetermined number of periods are counted;

wherein the interface controller is operable to transmit the count signal to a remote test device through the serial access port.

18. The system of claim 17, wherein the measurement command is received from a JTAG host device.

19. The system of claim 17, wherein the measurement module includes a counter and a synchronization control unit to transmit the count signal.

20. The system of claim 17, wherein the embedded clock has a substantially higher frequency than the serial access port clock.

21. A method of determining a system clock frequency of a device, the method comprising:

providing a measurement command to a device having a) internal circuitry that is controlled by a system clock signal having a system clock frequency and corresponding system clock period and b) a test access port configured to receive, relative to a test clock signal having a test clock frequency and corresponding test clock period, commands to test the internal circuitry or measure the system clock frequency; wherein the measurement command is provided through the test access port and causes a signal to be asserted for a number of system clock periods corresponding to a count value associated with the command;

determining a number of test clock periods that substantially correspond to a period during which the signal is asserted;

calculating the system clock frequency based on the determined number of test clock periods, the test clock frequency and the count value; and adjusting the frequency of the test clock signal based on the calculated system clock frequency to optimize a rate at which commands can be provided to the test access port.

22. The method of claim 21, wherein adjusting the frequency of the test clock signal comprises adjusting the frequency of the test clock signal to be an integer fraction of the calculated system clock frequency.

23. A device comprising:

internal circuitry that is controlled by a system clock signal having a system clock frequency and corresponding system clock period;

a serial test access port configured to receive, relative to a test clock signal having a test clock frequency and corresponding test clock period that are different than the respective system clock frequency and system clock period, a command to test the internal circuitry or measure the system clock frequency;

a module that receives a measurement command comprising a count value from the serial test access port, and causes a measurement output to be provided at the serial test access port for a number of system clock periods corresponding to the count value.

24. The device of claim 23, further comprising a counter that is loaded with the count value and decremented to a count value of zero at a rate corresponding to the system clock frequency, wherein the measurement output is provided while the counter is decrementing.

25. The device of claim 24, further comprising a second counter that counts test clock periods that elapse while the counter is decrementing.

26. The device of claim 25, wherein the number of elapsed test clock periods are provided at the serial test access port when the counter reaches a count value of zero.

* * * * *

UNITED STATES PATENT AND TRADEMARK OFFICE
CERTIFICATE OF CORRECTION

PATENT NO. : 7,506,228 B2  Page 1 of 1
APPLICATION NO. : 11/353855
DATED : March 17, 2009
INVENTOR(S) : Frode Milch Pedersen It is certified that error appears in the above-identified patent and that said Letters Patent is hereby corrected as shown below:

On the Cover Page, Other Publications, line 1, replace:
"Paul Hoakstra, A Wavelets Approach to Voice Recognition, Nov. 29," with
-- Paul Hoekstra, A Wavelets Approach to Voice Recognition, Nov. 29, --

On the Cover Page, (57) Abstract, line 14, replace:
"clock that is a integral fraction of the IC clock." with
-- clock that is an integral fraction of the IC clock. --

Column 3, Line 39; replace:
"120. Optionally the TSRT signal may be sent." with
-- 120. Optionally the TRST signal may be sent. --

Column 3, Line 58; replace:
"instruction storage and dynamic Dynamic Random Access" with
-- instruction storage and Dynamic Random Access --

Column 6, Line 44; replace:
"Fig. 2, can perform This operation by entering the Shift-DR" with
-- Fig. 2, can perform this operation by entering the Shift-DR --

Column 8, Line 14; replace:
"TAP controller 120 The selection of the count value may" with
-- TAP controller 120. The selection of the count value may --

Signed and Sealed this

First Day of September, 2009

David J. Kappos
*Director of the United States Patent and Trademark Office*